United States Patent
Rudin

(10) Patent No.: US 7,745,735 B2
(45) Date of Patent: Jun. 29, 2010

(54) CROSS-OVER OF CONDUCTIVE INTERCONNECTS AND A METHOD OF CROSSING CONDUCTIVE INTERCONNECTS

(75) Inventor: John Christopher Rudin, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 896 days.

(21) Appl. No.: 10/564,238

(22) PCT Filed: Jul. 9, 2004

(86) PCT No.: PCT/GB2004/002983

§ 371 (c)(1),
(2), (4) Date: Jun. 16, 2006

(87) PCT Pub. No.: WO2005/009095

PCT Pub. Date: Jan. 27, 2005

(65) Prior Publication Data

US 2007/0033796 A1      Feb. 15, 2007

(30) Foreign Application Priority Data

Jul. 12, 2003   (GB) ................................. 0316351.6

(51) Int. Cl.
*H01R 12/04* (2006.01)
*H05K 1/11* (2006.01)
*H05K 3/36* (2006.01)

(52) U.S. Cl. ........................................ 174/261; 29/830
(58) Field of Classification Search ................. 174/261; 29/830
See application file for complete search history.

(56) References Cited

U.S. PATENT DOCUMENTS

| 3,615,949 | A | 10/1971 | Hicks | |
| 4,159,222 | A | 6/1979 | Lebow et al. | |
| 4,520,228 | A | 5/1985 | Hoffmann | |
| 5,298,687 | A | 3/1994 | Rapoport et al. | |
| 6,380,729 | B1 * | 4/2002 | Smith | ...................... 324/158.1 |
| 6,916,996 | B2 * | 7/2005 | Kuan et al. | ................. 174/262 |
| 7,061,771 | B2 * | 6/2006 | Miller | ........................ 361/772 |
| 7,288,726 | B2 * | 10/2007 | Chang | ........................ 174/261 |
| 2001/0036064 | A1 | 11/2001 | Li | |

FOREIGN PATENT DOCUMENTS

| EP | 0 317 011 | 5/1989 |
| GB | 1 005 943 | 9/1965 |
| GB | 1 287 791 | 9/1972 |

* cited by examiner

*Primary Examiner*—Jeremy C Norris

(57) ABSTRACT

A cross-over (140); of first (142) and second (144) separate elongate conductive interconnects, comprising: a first elongate conductive interconnect (142); a first conductive portion (110a) separate from the first elongate conductive interconnect (142); a second conductive portion (110b) separate from the first elongate conductive interconnect (142); first insulating material (122) adjacent at least a portion (111) of the first elongate conductive interconnect (142); and a third electro-deposited metal portion (124) extending adjacent the first insulating material (122) to interconnect the first (110a) and second (110b) conductive portions, wherein the first (110a), second (110b) and third (124) portions are interconnected portions of the second elongate conductive interconnect (144); and a substrate, wherein the first insulating material and the third electro-deposited metal portion are positioned between the substrate and the first elongate conductive interconnect.

20 Claims, 4 Drawing Sheets

CROSS-OVER OF CONDUCTIVE INTERCONNECTS AND A METHOD OF CROSSING CONDUCTIVE INTERCONNECTS

FIELD OF THE INVENTION

Embodiments of the invention relate to a cross-over of separate elongate conductive interconnects.

BACKGROUND TO THE INVENTION

JP63299296 (Meiko), JP63299297A (Meiko) and "Manufacturing of Printed Wiring Boards by Ultra-high Speed Electroforming" by Norio Kawachi (Meiko) et al, Printed Circuit World Convention, June 1990 describe the use of the electroforming technique in creating circuit boards (printed wiring boards). Electroforming is an additive process that involves obtaining a replica (negative) of a metal carrier by electrolytic deposition of a metallic film using the carrier as a cathode. A patterned photo-resist is used to limit the electro-deposition of material to the exposed areas of the cathode. The documents additionally teach a transfer lamination process in which the deposited metal and photo-resist are laminated to a substrate and the master is removed leaving a deposited metal photo-resist substrate combination. JP63299296 (Meiko), JP63299297A (Meiko) additionally disclose the electrolytic deposition of a copper plate layer on the master before the deposition of the metal. This copper layer is transferred in the transfer-lamination process and is removed by etching.

U.S. Pat. No. 6,284,072 discloses the formation of patterning on a conductive carrier by micro-moulding. An insulating material is embossed to create a pattern that limits the electro-deposition of metal to exposed areas of the conductive carrier.

Many different applications require a cross-over of elongate conductive interconnects. For example, circuitry with a matrix of conductive interconnects, such as matrix display devices, may have thousands or millions of such cross-overs.

In the bulk semi-conductor field, the conductive interconnects are normally separated into different electrically insulated layers of the semiconductor device. Vias through the insulating layers of the device are used to form electrical connection to the conductive interconnects.

In some applications, such as display devices, it is desirable to have a thin device and it is undesirable to separate, into separate electrically insulated layers, the conductive interconnects that cross-over.

It would be desirable to provide a cross-over for conductive interconnects without separating the conductive interconnects into different insulated layers.

BRIEF DESCRIPTION OF THE INVENTION

The inventor has realized that a cross-over of first and second interconnects can be formed by bridging the first conductive interconnect using electro-deposited metal that forms part of the second interconnect.

According to one embodiment of the invention there is provided a cross-over of first and second separate elongate conductive interconnects, comprising: a first elongate conductive interconnect; a second elongate conductive interconnect comprising: a first conductive portion separate from the first elongate conductive interconnect; a second conductive portion separate from the first elongate conductive interconnect and the first conductive portion; and a third electro-deposited metal portion interconnecting the first and second conductive portions; and first insulating material between the first elongate conductive interconnect and the third electro-deposited metal portion of the second elongate interconnect; and a substrate, wherein the first insulating material and the third electro-deposited metal portion are positioned between the substrate and the first elongate conductive interconnect.

According to another embodiment of the invention there is provided a cross-over of first and second conductive means, comprising: first conductive means; second conductive means comprising: a first conductive portion separate from the first conductive means; a second conductive portion separate from the first conductive means and the first conductive portion; and a third electro-deposited metal portion interconnecting the first and second conductive portions; and first insulating means for insulating the first conductive means from the second conductive means wherein the first insulating means directly contacts the third electro-deposited metal portion.

According to another embodiment of the invention there is provided a method of crossing a first elongate conductive interconnect and a separate second elongate conductive interconnect in an integrated circuit, comprising: a) forming a first elongate conductive interconnect; b) forming a first conductive portion separate from the first elongate conductive interconnect; c) forming a second conductive portion separate from the first elongate conductive interconnect; d) depositing first insulating material over at least a portion of the first elongate conductive interconnect; and e) electro-depositing metal to form a third electro-deposited metal portion extending over the first insulating material to interconnect the first and second conductive portions and form the second elongate conductive interconnect; and f) transferring the structure formed in steps a) to e) to a substrate.

The inventor has realized that a cross-over of first and second interconnects can be formed by bridging the first conductive interconnect using electro-deposited metal that forms part of the second interconnect before transfer to a final substrate. In some embodiments, both the first and second interconnects are formed by electro-deposition of material before transfer to a final substrate.

The method has the advantage that it can be performed at low temp (room temp +/−100 degrees Celsius) and without a vacuum. Furthermore, there is no processing required on the final substrate, which may be plastic and susceptible to damage.

The method reduces the need for the accurate alignment of masks as the electro-deposition of metal on metal is self-aligning. This is particularly useful for large substrates (centimeters or meters) where accurate mask alignment is very difficult. Furthermore, the structure is thin and suitable for use on flexible substrates.

The terms electro-deposition and electrolytic deposition are synonymous.

BRIEF DESCRIPTION OF THE DRAWINGS

For a better understanding of the invention and to understand how it may be brought into effect reference will now be made to the accompanying drawings of an example embodiment of the invention in which.

DETAILED DESCRIPTION OF EMBODIMENTS OF THE INVENTION

FIGS. 1A to 1F schematically illustrate stages in an additive method for crossing first and second interconnects using electrolytic deposition and transfer lamination. The figures are not to scale. Each of FIGS. 1A to 1F includes two separate views. A plan view is illustrated on the left and a cross-sectional view (along the line X-Y) is illustrated on the right. An orthogonal x-direction, y-direction coordinate system is defined for the plan views.

Figure 1A:
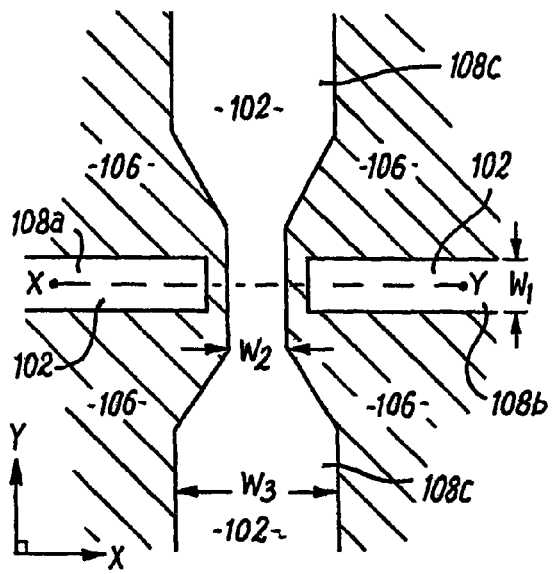
FIGS. 1A to 1F illustrate stages in forming a cross-over.
Figure 1A:
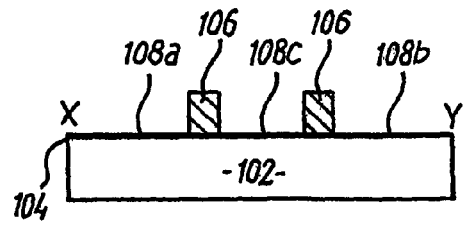
Figure 1B:
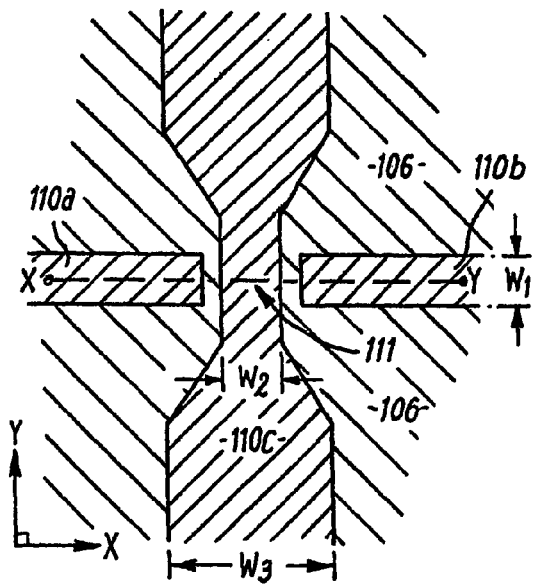
Figure 1B:
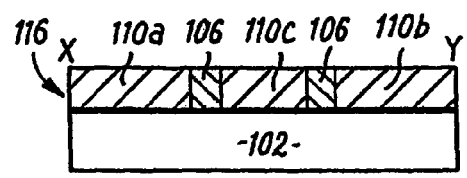

FIGS. 1A and 1B illustrate the formation of a first layer 116 of the cross-over 140.

FIG. 1A illustrates a passivated substantially planar conductive carrier 102 on which insulating material 106 has been selectively formed. The passivated conductive carrier 102 may be a platen or a sheet of material in a roll to roll process. The passivated substantially planar conductive carrier 102 includes a passivation layer 104 this may for example include a very thin oxide and/or a surfactant. Insulating material 106 is selectively formed on the passivated conductive carrier 102.

Insulating material 106 is selectively formed on the passivated conductive carrier 102 by a selective additive process or a selective subtractive process. In a selective subtractive process, insulating material is deposited over the whole of the passivated conductive carrier 102 as a substantially planar layer and selectively removed from first, second and third portions 108a, 108b and 108c of the passivated conductive carrier 102. In a selective additive process, insulating material is deposited only in the regions of the passivated conductive carrier 102 where required to form patterned structures 106. This may be achieved, for example, by embossing, micro-molding, photolithography or any suitable alternative process. If photolithography is used, the insulating material 106 is preferably photo-patternable. It is selectively exposed to radiation through a mask or using a spot-laser and developed to expose the portions 108a, 108b and 108c of the conductive carrier 102. One suitable photo-patternable insulator is SU-8 by Micro-Chemical Corporation, which is a hard UV cure polymer, which is used at a thickness of between 1 and 5 µm.

The third exposed second portion 108c is elongate and of variable width. It extends lengthwise in the y-direction and narrows from a width W3 to a width W2 at a neck and then widens again to the width W3. The first and second exposed portion 108a and 108b are elongate. They both extend along the same line in the x-direction with a width W1, but are not joined. They are separated by the third exposed portion 108c and the insulating material 106 defining its neck.

The conductive carrier 102 is connected as a cathode and metal is deposited by anisotropic electrolytic deposition to complete the first layer 116, as shown in FIG. 1B. Metal is deposited on the first, second and third exposed portions 108a, 108b and 108c of to form respective first, second and third metal portions 110a, 110b and 110c. The metal may be any metal that is capable of electrolytic deposition with good conductivity e.g. Ni, Cu, Ag, Au. It is typically deposited with a thickness of between 1 and 5 µm, to substantially the same thickness as the insulating material 106.

The third metal portion 110c fills the trench formed by the insulating material 106 and the exposed third portion 108c of the passivated conductive layer 102. The third metal portion 110c is consequently elongate, extending lengthwise in the y-direction. It narrows from a width W3 to a neck 111 of width W2 and then widens to a width W3. The third metal portion 110c forms the first conductive interconnect 142 of the cross-over 140 illustrated in FIG. 2.

The first metal portion 110a and the second metal portion 110b fill the respective trenches formed by the insulating material 106 and the first and second exposed portions 108a and 108b of the passivated conductive layer 102. Both the first and second metal portion 110a and 110b are consequently elongate, extending lengthwise in the x-direction with a width W1 in the y-direction. The first and second metal portions 110a and 110b will eventually form interconnected portions of the second conductive interconnect 144 of the cross-over 140 illustrated in FIG. 2.

Figure 1C:
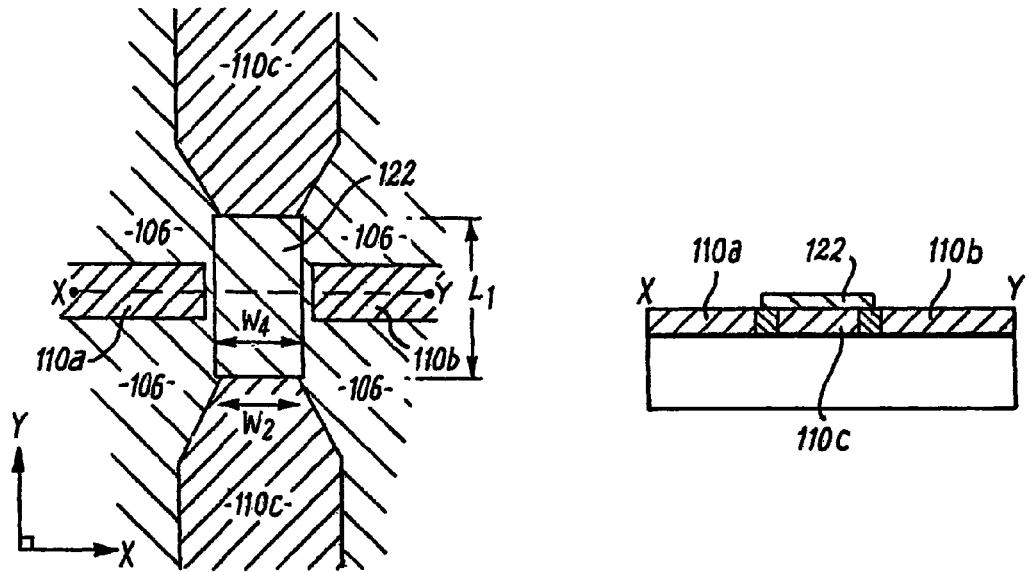

In FIG. 1C, dielectric material 122 is selectively formed. It covers the neck part 111 of the third metal portion 110c and overlaps the portions of the insulating layer 106 that separate the third metal portion 110c from the first metal portion 110a and separate the third metal portion 110c from the second metal portion 110b. The dielectric material 122 forms a "tombstone" supported by the insulating layer 106. It has a length in the y-direction of L1, which is greater than W1 (and W5) and a width W4 in the x-direction that is greater than W2. It completely covers the necked part 111 of the third metal portion 110c.

The dielectric material 122 may be formed from a photo paternable material, such as SU8, which is deposited over the whole of the first layer 116 and laser spot cured in the area where it is to remain. Development of the resist removes it to selectively form the "tombstone" of dielectric material 122 covering part of the third metal portion 110c. The overlap of the dielectric material 122 with the portions of the insulating layer 106 provides tolerance in the alignment of the laser.

The dielectric material 122 therefore covers the necked part 111 of the third metal portion and masks it from further electrolytic deposition. The dielectric material 122 separates the first conductive interconnect 142 from the second conductive interconnect 144 in the final cross-over 140. The dielectric layer typically has a thickness of the order 0.5-3 µm.

Figure 1D:
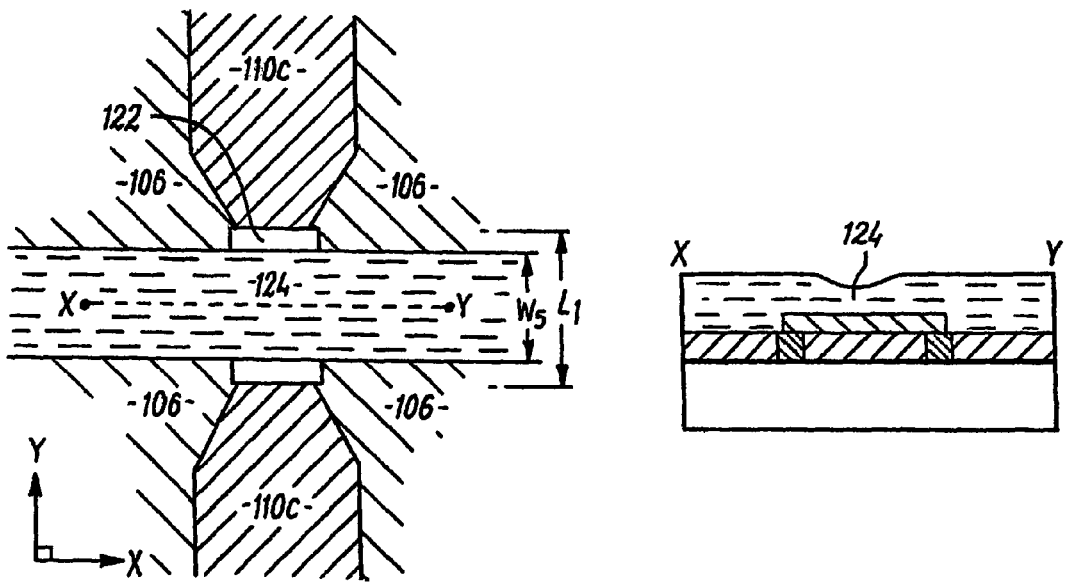

Less anisotropic (substantially isotropic) electrolytic deposition of metal is then carried out to form a metal layer 124, as illustrated in FIG. 1D. For clarity the deposition is not illustrated as occurring on the exposed parts of the third metal portion 110c. Less anisotropic electrolytic deposition can be achieved by adding brightening or self-leveling agents (ionic-organic complexes such as Coumarin) to the electrolytic solution.

Metal substantially isotropically deposited on the first metal portion 110a and metal isotropically on the second metal portion 110b meet over the insulating material 122 and form the metal layer 124. The metal layer 124 is elongate. It extends lengthwise in the x-direction and has a width W5 (W1<W5<L1). It overlies the first and second metal portions 110a and 110b, strips of insulating material 106 adjacent the first and second metal portions and the insulating material 122 overlying the neck of the third metal portion 110c, but its width does not exceed the length L1 of the tombstone of insulating material 122. The metal layer 124 does not therefore electrically contact the third metal portion 110c and forms a part of the second conductive interconnect 144 of the cross-over 140 illustrated in FIG. 2.

Figure 1E:
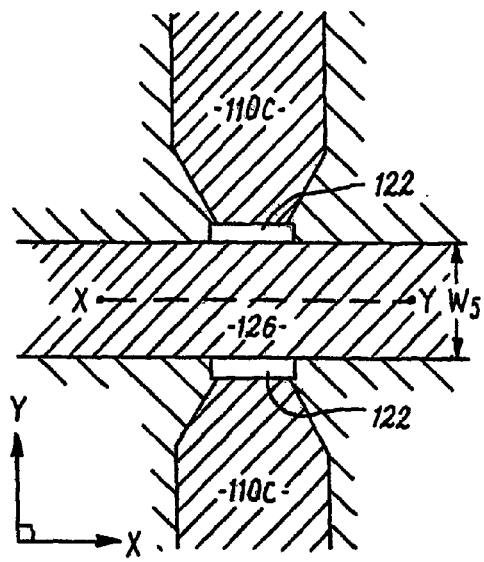
Figure 1E:
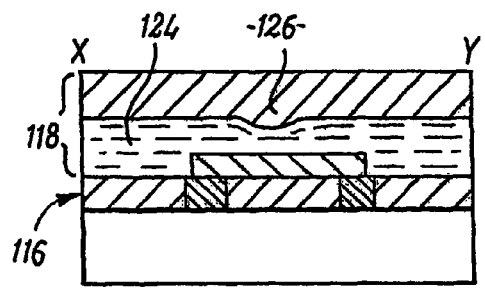

Anisotropic (dull) electrolytic deposition of metal is then carried out to form a metal layer 126 over the metal later 124, as illustrated in FIG. 1E. For clarity the deposition is not illustrated as occurring on the exposed parts of the second metal portion 110b. This metal layer 126 gives the desired conductivity in the second conductive interconnect 144 and electric current may be carried predominantly in this metal layer.

The metal layer 126 is elongate. It extends lengthwise in the x-direction and has a width W5 (W1<W5<L1). The metal layer 126 does not therefore electrically contact the third metal portion 110c and forms a final part of the second conductive interconnect 144 of the cross-over 140 illustrated in FIG. 2. The tombstone of insulating material 122, the metal layer 124 and the metal layer 126 occupy a second layer 118 of the cross-over 140.

A passive substrate 114 is then adhered to the substantially planar surface of the second layer 118 using a layer of adhesive 112. The adhesive layer 112 is cured using ultra-violet (UV) radiation or applied heat. The structure may then be shock-cooled and the passivated conductive carrier 102 is removed (peeled-off) to form the cross-over device 140, as illustrated in FIG. 1F.

The substrate 114 may be made of any material but is preferably a flexible plastic substrate e.g. PET. The adhesive used may be NOA81 by Norland Products, Inc. The thickness of the substrate 114 is typically between 50 and 200 µm. The thickness of the adhesive layer 112 is typically between 5 and 20 µm and is thick enough to completely cover the cross-over structure.

Figure 1F:
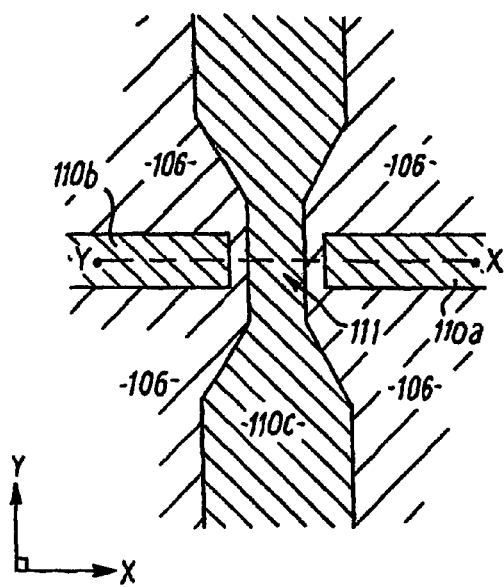
Figure 1F:
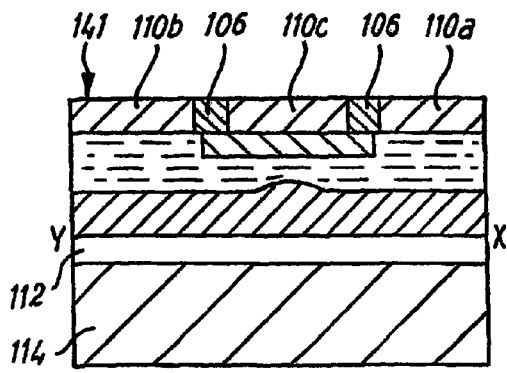
Figure 2:
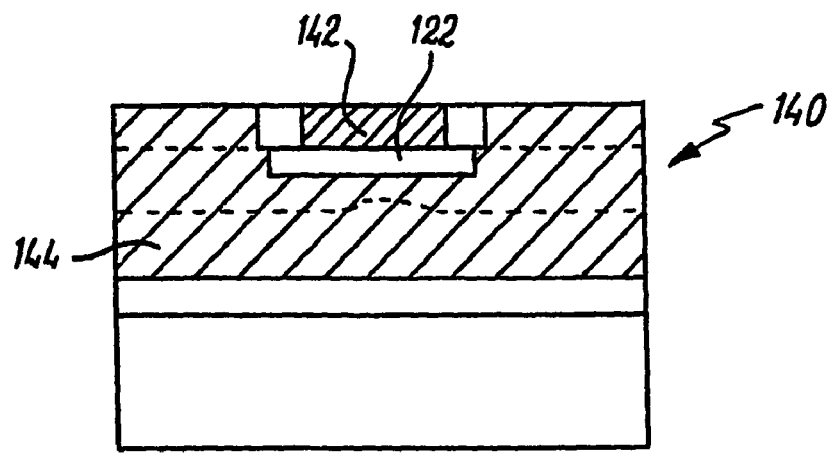
FIG. 2 schematically illustrates a cross-over.

The cross-over 140, as illustrated in FIG. 1F and FIG. 2, has an upper substantially planar surface 141 including the upper substantially planar surfaces of the first, second and third metal portions 110a, 110b and 110c.

The cross-over 140 has a first elongate conductive interconnect 142; a second elongate conductive interconnect 144 comprising a first conductive portion 110a separate from the first elongate conductive interconnect 142; a second conductive portion 110b separate from the first elongate conductive interconnect 142; a third electro-deposited metal portion 124 interconnecting the first 110a and second 110b conductive portions, and first insulating material 122 between the first elongate conductive interconnect 142 and the third electro-deposited metal portion 124. The bridging portion of second elongate conductive interconnect adjacent the tombstone of dielectric 122 is completely encapsulated within the final structure.

Figure 3:
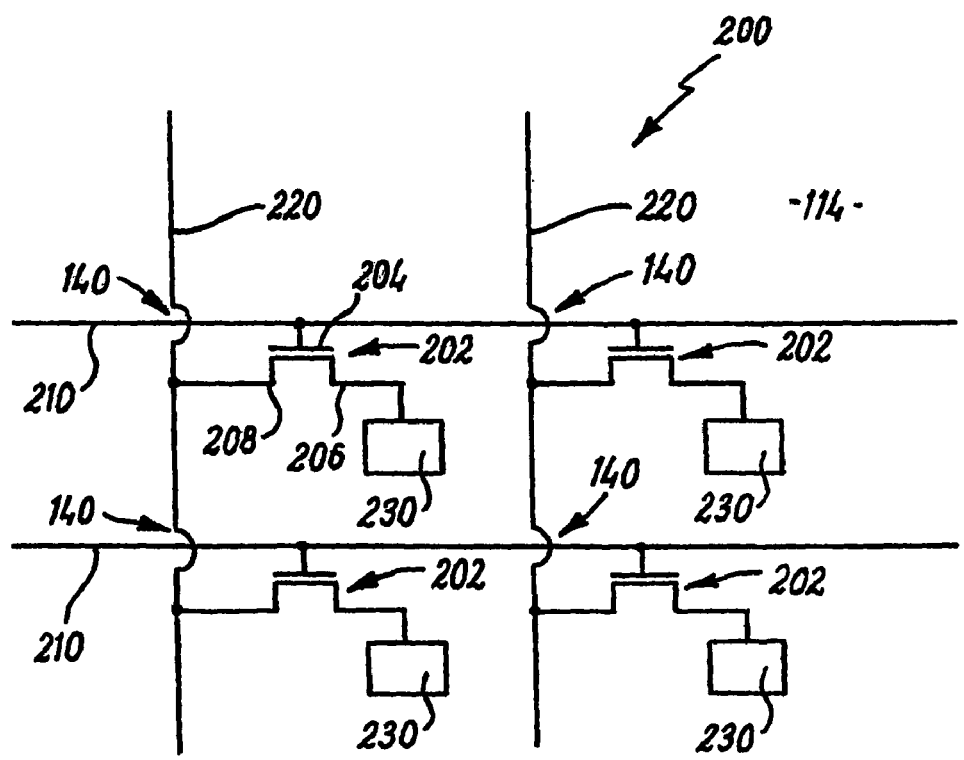
FIG. 3 illustrates a portion of an active matrix display device.

FIG. 3 schematically illustrates a portion of an active matrix display 200. The active matrix display 200 has N*M pixels arranged in an N row by M column array. The display 200 has N row address lines 210 and M column address lines 220. A particular pixel is uniquely controlled using a particular row address line and a particular column address line. Each pixel has an associated organic thin film transistor (TFT) 202 that has a gate electrode 204, a source electrode 206 and a drain electrode 208. The gate electrode 204 of the TFT 202 for the pixel at row n and column m is connected to nth row address line and its drain 208 is connected to the nth column address line. Its source is connected to the pixel element 230 in the nth row and mth column of the N by M array. The nth column address line and nth row address line have a cross-over 140. The nth column address line and mth column address line are respectively provided by the first conductive interconnect 142 and the second conductive interconnect 144 or by the second conductive interconnect 144 and the first conductive interconnect 142. The substrate 114 may be a large area flexible plastic substrate (many square centimeters or meters).

Any one or more of the electroforming steps used to define the first conductive interconnect 142 and the parts of the second conductive interconnect 144, may additionally form one or more of the source, drain or gate electrodes of the TFTs 202 of the display 200.

It should be appreciated that the method described with reference to the drawings has a number of advantages. The method requires less masks and the associated problem of their accurate alignment. The use of electrolytic deposition of metal on the first and second metal portions to bridge the gap between them is a self-aligning process. The cross-over structure becomes embedded in the transfer adhesive 112 which improves robustness.

Although embodiments of the present invention have been described in the preceding paragraphs with reference to various examples, it should be appreciated that modifications to the examples given can be made without departing from the spirit and scope of the invention.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. A cross-over structure of first and second separate elongate conductive interconnects, comprising:
   a first elongate conductive interconnect;
   a second elongate conductive interconnect comprising:
      a first conductive portion separate from the first elongate conductive interconnect;
      a second conductive portion separate from the first elongate conductive interconnect and the first conductive portion; and
      a third electro-deposited metal portion interconnecting the first and second conductive portions; and
   first insulating material between the first elongate conductive interconnect and the third electro-deposited metal portion of the second elongate conductive interconnect; and a substrate, wherein:
   the first insulating material and the third electro-deposited metal portion are positioned between the substrate and the first elongate conductive interconnect; and
   the first insulating material is supported by separate second insulating material between the first conductive portion and the first elongate conductive interconnect, and between the second conductive portion and the first elongate conductive interconnect.

2. A cross-over as claimed in claim 1, wherein the first and second elongate conductive interconnects are formed from electro-deposited metal.

3. A cross-over as claimed in claim 1, having a first layer and a second layer, wherein the first elongate conductive interconnect occupies at least the first layer and the second elongate conductive interconnect occupies the first and second layers.

4. A cross-over as claimed in claim 3, wherein the first layer comprises at least a portion of the first elongate conductive interconnect, the first conductive portion, the second conductive portion and the second insulating material between the first conductive portion and the first elongate conductive interconnect, and between the second conductive portion and the first elongate conductive interconnect; and the second layer comprises first insulating material adjacent at least a portion of the first elongate conductive interconnect, and the third interconnecting metal portion.

5. A cross-over as claimed in claim 1, wherein the first elongate conductive layer comprises electro-deposited metal.

6. A cross-over as claimed in claim 1, wherein the first elongate conductive interconnect is formed from the same material as the first and second portions of the second conductive interconnect.

7. A cross-over as claimed in claim 1, wherein the first and second conductive portions comprise electro-deposited metal and each extends in a second direction at an angle to the first direction of elongation of the first elongate conductive member.

8. A cross-over as claimed in claim 1, wherein the third metal portion bridges the first insulating material.

9. A cross-over as claimed in claim 8, wherein the third metal portion is encapsulated and underlies the first insulating material.

10. A cross-over as claimed in claim 1 having a substantially planar surface including substantially planar surface portions of the first and second conductive interconnects.

11. A cross-over as claimed in claim 1 further comprising insulating adhesive material between the substrate and the first and second conductive interconnects.

12. An active-matrix display, comprising a plurality of cross-overs as claimed in claim 1.

13. A method of crossing a first elongate conductive interconnect and a separate second elongate conductive interconnect in an integrated circuit structure, comprising:
    a) forming a first elongate conductive interconnect;
    b) forming a first conductive portion separate from the first elongate conductive interconnect;
    c) forming a second conductive portion separate from the first elongate conductive interconnect;
    d) depositing first insulating material over at least a portion of the first elongate conductive interconnect; and
    e) electro-depositing metal to form a third electro-deposited metal portion extending over the first insulating material to interconnect the first and second conductive portions and form the second elongate conductive interconnect; and
    f) transferring the structure formed in a) to e) to a substrate, wherein the second elongate conductive interconnect extends the length of the integrated circuit structure.

14. A method as claimed in claim 13, wherein d) involves the selective retention of photo-curable material.

15. A method as claimed in claim 13, wherein, in a), the first elongate conductive interconnect is formed by electro-deposition of metal;
    in b), the first conductive portion of the second elongate conductive interconnect is formed by electro-deposition of metal; and
    in c), the second conductive portion of the second elongate conductive interconnect is formed by electro-deposition of metal.

16. A method as claimed in claim 13, wherein a), b) and c) occur at the same time during a single metal electro-deposition process.

17. A method as claimed in claim 16, wherein the metal electro-deposition process involves masked electrolytic deposition.

18. A method as claimed in claim 17, wherein the mask is second insulator material that is incorporated into the final structure.

19. A cross-over formed by the method of claim 13.

20. A cross-over structure of first and second conductive means, comprising:
    first conductive means having a narrowed inner portion bounded by wider outer portions;
    second conductive means comprising:
        a first conductive portion separate from the first conductive means;
        a second conductive portion separate from the first conductive means and the first conductive portion; and
    a third electro-deposited metal portion interconnecting the first and second conductive portions; and
    first insulating means for insulating the first conductive means from the second conductive means, the first insulating means directly contacting the third electro-deposited metal portion, the first insulating means positioned over the narrowed inner portion of the first conductive means but not over the wider outer portions of the first conductive means.

* * * * *